United States Patent
Souria et al.

(12) 
(10) Patent No.: US 10,498,299 B2
(45) Date of Patent: Dec. 3, 2019

(54) BASEBAND AMPLIFIER CIRCUIT

(71) Applicant: NXP USA, Inc., Austin, TX (US)

(72) Inventors: Charaf Eddine Souria, Toulouse (FR); Cristian Pavao Moreira, Frouzins (FR)

(73) Assignee: NXP USA, Inc., Austin, TX (US)

( * ) Notice: Subject to any disclaimer, the term of this patent is extended or adjusted under 35 U.S.C. 154(b) by 275 days.

(21) Appl. No.: 15/798,961

(22) Filed: Oct. 31, 2017

(65) Prior Publication Data

US 2018/0123536 A1 May 3, 2018

(30) Foreign Application Priority Data

Nov. 1, 2016 (EP) ...................... 16306434

(51) Int. Cl.
*H03F 3/45* (2006.01)
*G01S 7/02* (2006.01)

(52) U.S. Cl.
CPC ............ *H03F 3/45089* (2013.01); *G01S 7/02* (2013.01)

(58) Field of Classification Search
CPC .......... G01S 7/02; H03F 1/0261; H03F 3/195; H03F 3/26; H03F 3/45; H03F 3/45089
USPC ........................................... 342/175
See application file for complete search history.

(56) References Cited

U.S. PATENT DOCUMENTS

| | | | |
|---|---|---|---|
| 6,094,108 A | 7/2000 | Suematsu et al. | |
| 6,366,171 B1 | 4/2002 | Litmanen et al. | |
| 6,590,422 B1 | 7/2003 | Dillon | |
| 7,697,915 B2 | 4/2010 | Behzad et al. | |
| 7,741,910 B2 | 6/2010 | Wong | |
| 7,860,454 B2* | 12/2010 | Moloudi ............ | H03H 11/1291 330/300 |
| 9,425,748 B2 | 8/2016 | Pavo-Moreira et al. | |
| 2002/0105360 A1 | 8/2002 | Kim et al. | |
| 2003/0130006 A1 | 7/2003 | Reynolds | |
| 2006/0103468 A1* | 5/2006 | Su ............................ | H03F 1/22 330/301 |
| 2006/0202760 A1* | 9/2006 | Simon ..................... | H03F 1/223 330/254 |
| 2010/0102855 A1 | 4/2010 | Takahashi | |

(Continued)

FOREIGN PATENT DOCUMENTS

| | | |
|---|---|---|
| EP | 2045915 A1 | 4/2009 |
| JP | 61285813 | 12/1986 |
| WO | WO-2006/030513 A1 | 3/2006 |

*Primary Examiner* — Timothy X Pham
(74) *Attorney, Agent, or Firm* — Charlene R. Jacobsen (57) ABSTRACT

A baseband amplifier circuit comprising a single-ended to differential converter followed by at least one boosted follower amplifier. The boosted follower amplifier comprises a first transconductance device arranged to control a first current between a first supply node and a first output node in response to a voltage at a first input node, a second transconductance device arranged to control a second current between the first output node and a second supply node in response to a voltage at a second input node, a third transconductance device arranged to control a third current between the first supply node and a second output node in response to a voltage at a third input node, and a fourth transconductance device arranged to control a fourth current between the second output node of the boosted follower amplifier and the second supply node in response to a voltage at a fourth input node.

14 Claims, 5 Drawing Sheets

(56) References Cited

U.S. PATENT DOCUMENTS

2011/0128036 A1\* 6/2011 Liu ................ H03K 19/018521
326/30

\* cited by examiner

BASEBAND AMPLIFIER CIRCUIT

CROSS-REFERENCE TO RELATED APPLICATIONS

This application claims the priority under 35 U.S.C. § 119 of European patent application no. 16306434.8, filed Nov. 1, 2016 the contents of which are incorporated by reference herein.

FIELD OF THE INVENTION

This invention relates to a baseband amplifier circuit, and in particular to a low-noise baseband amplifier circuit.

BACKGROUND OF THE INVENTION

A conventional wireless radio frequency (RF) receiver frontend topology comprises a low noise amplifier (LNA) arranged to amplifier signals received by an antenna, an active mixer (e.g. a Gilbert-type mixer) arranged to down-convert the amplified signals to a baseband frequency. Baseband filtering and variable gain amplification is then performed. Such a conventional RF receiver topology achieves good noise performance, but may eventually suffer from a poor compression point depending on the input signal level power.

Radar receivers, such as used within automotive advanced driver assistance systems, require both good noise and good compression point performance, and an acceptable trade-off using conventional receiver topologies is difficult to reach. To achieve good performance for both noise and compression point, radar receivers often use a different topology receiver frontend topology in which an unamplified signal received by the antenna is provided directly to the active mixer. By removing the LNA a better trade-off between noise and compression point can be achieved. However, the achievable receiver noise performance is limited, due mainly to the noise contribution of the active mixer because the mixer noise is not masked by any gain stage preceding it.

SUMMARY OF THE INVENTION

The present invention provides a baseband amplifier circuit and a radio frequency frontend module as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

The present invention is herein described with reference to the accompanying drawings in which there are illustrated example embodiments of a radio frequency (RF) receiver frontend module and a low-noise baseband amplifier. However, it will be appreciated that the present invention is not limited to the specific embodiments herein described and as illustrated in the accompanying drawings, and various modifications may be made without detracting from the inventive concept. Furthermore, because the illustrated embodiments may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention. Moreover, for simplicity and ease of understanding, embodiments have been illustrated and described in terms of those components deemed necessary for the understanding of the underlying concepts. Accordingly, and as will be apparent to a person skilled in the art, other components have been omitted from the drawings and the description in order not to obfuscate or distract from the teachings of the present invention.

Figure 1:
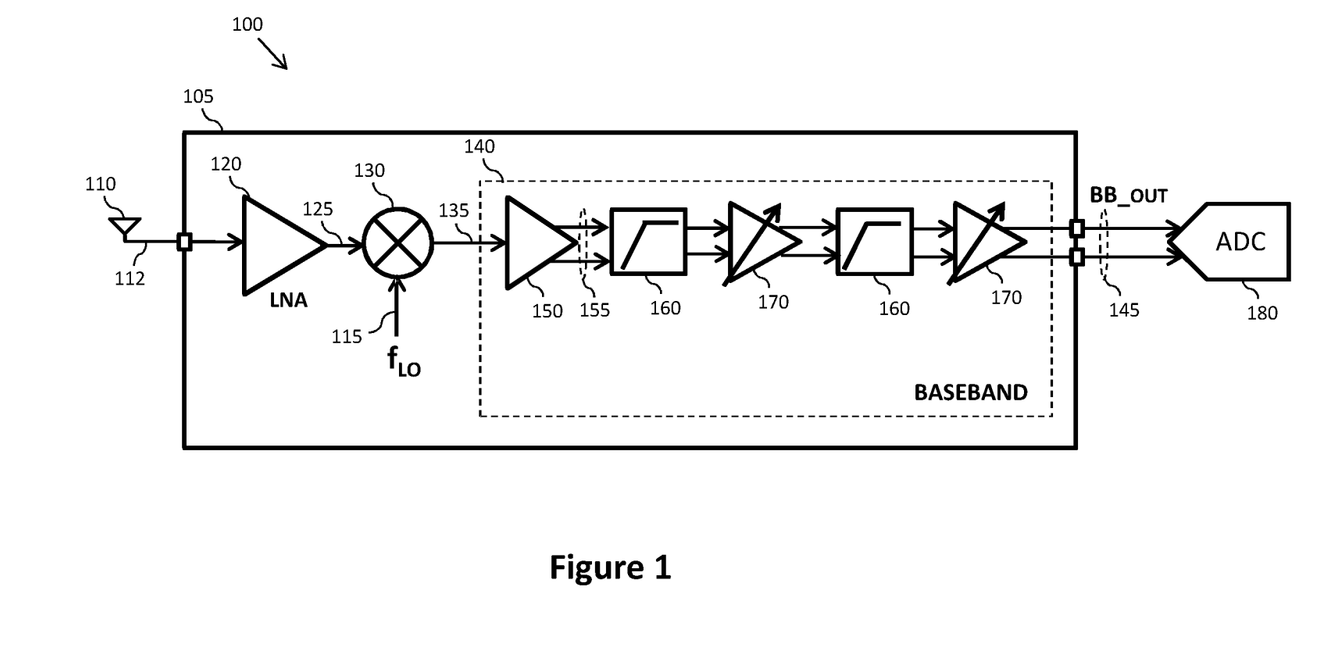
FIG. 1 schematically illustrates a simplified block diagram of an example embodiment of an radio frequency receiver frontend module.

Referring first to FIG. 1, there is schematically illustrated a simplified block diagram of an example embodiment of an RF receiver frontend module 100, which in the illustrated example is implemented within an integrated circuit device 105. An input of the RF receiver frontend module 100 is arranged to be coupled to an antenna 110. The RF receiver frontend module 100 comprises a low noise amplifier (LNA) component 120 to which an RF signal 112 received from the antenna 110 is provided. Although not illustrated in FIG. 1, band pass filtering may be applied to the received RF signal 112 before being provided to the LNA component 120. The LNA component 120 amplifies the received RF signal 112, and outputs the amplified RF signal 125 to a single-ended passive mixer component 130 which mixes the amplified RF signal 125 with a conversion signal, which in the illustrated example comprises a local oscillator signal 115, to down-convert the amplified RF signal 125 to a baseband frequency signal 135. The baseband frequency signal 135 is then provided to a baseband component 140 in which baseband filtering and variable gain amplification is then performed. In the illustrated example such baseband filtering and variable gain amplification is performed by a series of high-pass filter components 160 and variable gain amplifiers 170. The baseband component 140 then outputs a baseband signal 145, which may be provided to an analogue to digital converter (ADC) 180 for further (digital) processing.

Advantageously, by using a single-ended passive mixer 130 to down-convert the received RF signal to the baseband frequency, a significant reduction in the amount of noise introduced into the baseband signal by the mixer component is achieved as compared within convention receiver frontend topologies that use an active mixer. Due to the relatively low gain of the LNA and passive mixer arrangement, the baseband component 140 of the illustrated example further comprises a baseband (ultra) low-noise amplifier 150 arranged to receive the single-ended baseband frequency signal 135 output by the passive mixer component 130 and output an amplified baseband frequency signal 155 to which the baseband filtering and variable gain amplification is then performed, which in the illustrated example comprises a differential baseband frequency signal 155. By providing the baseband low-noise amplifier 150 to amplify the baseband frequency signal, an acceptable gain for the received signal may be achieved. In order to achieve good noise performance of the baseband signal 145 output by the baseband component 140, the performance of the baseband amplifier 150 is of high importance.

Figure 2:
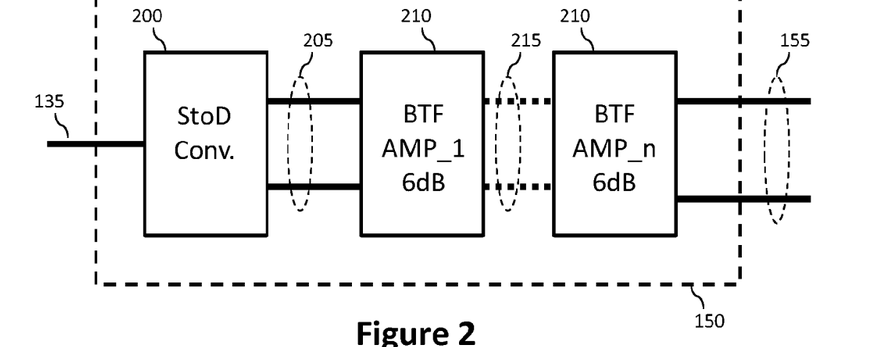
FIG. 2 schematically illustrates a simplified block diagram of an example of a baseband amplifier circuit with embedded single-to-differential conversion.

Referring now to FIG. 2, there is schematically illustrated a simplified block diagram of an example of a baseband amplifier circuit 150 such as may be used to implement the baseband amplifier 150 illustrated in FIG. 1. The baseband amplifier circuit 150 of FIG. 2 comprises a single-ended to differential converter 200 arranged to receive at an input thereof a single-ended input signal to be amplified, such as the single-ended baseband frequency signal 135 output by the passive mixer component 130 of the RF receiver frontend module 100 of FIG. 1, and to convert the single-ended input signal 135 into a differential signal 205. The baseband amplifier circuit 150 of FIG. 2 further comprises a series of n (i.e. one or more) amplifier module(s), coupled one after the other (output to input as illustrated in FIG. 2) when n>1. In the example illustrated in FIG. 2), each amplifier module comprises a boosted follower amplifier 210 arranged to receive at a differential input thereof a differential signal 205, 215 to be amplified and to output an amplified differential signal 215, 155 based on the received differential input signal 205, 215. For example, and as illustrated in FIG. 2, a first boosted follower amplifier component 210 is arranged to receive the differential signal 205 output by the single-ended to differential converter 200, whilst each subsequent boosted follower amplifier component 210 within the series is arranged to receive the differential signals 215 output by the preceding boosted follower amplifier component 210 within the series. The amplified differential signal 155 output by a last boosted follower amplifier component 210 may the form the basis of (or constitute) the amplified baseband frequency signal 155 to which baseband filtering and variable gain amplification is subsequently performed within the baseband component 140 of the RF receiver frontend module 100 of FIG. 1.

Figure 3:
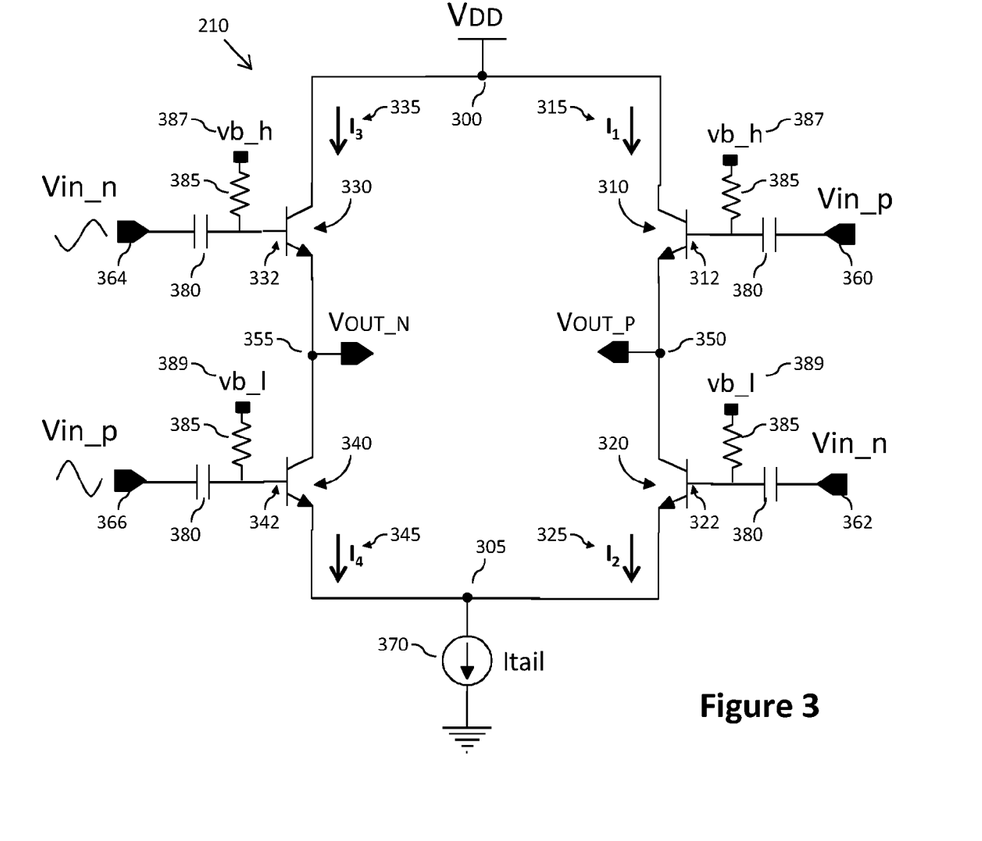
FIG. 3 schematically illustrates a simplified circuit diagram of an example of a boosted follower amplifier component.

FIG. 3 schematically illustrates a simplified circuit diagram of an example of a boosted follower amplifier component 210 such as may be used to implement the boosted follower amplifier components 210 illustrated in FIG. 2. The boosted follower amplifier component 210 illustrated in FIG. 3 comprises four transconductance devices 310-340, which in the illustrated example are implemented by way of bipolar junction transistors. However, it is contemplated that the transconductance devices 310-340 may be implemented using other devices, for example metal oxide semiconductor field effect transistors or the like. A first transconductance device 310 is arranged to control a first current 315 between a first supply node 300 and a first output node 350 of the boosted follower amplifier component 210 in response to a voltage at an input terminal 312 thereof. The input terminal 312 of the first transconductance device 310 is coupled to a first input node 360 of the boosted follower amplifier component 210. A second transconductance device 320 is arranged to control a second current 325 between the first output node 350 of the boosted follower amplifier component 210 and a second supply node 305 in response to a voltage at an input terminal 325 thereof. The input terminal 322 of the second transconductance device 320 is coupled to a second input node 362 of the boosted follower amplifier component 210. A third transconductance device 330 is arranged to control a third current 335 between the first supply node 300 and a second output node 355 of the boosted follower amplifier component 210 in response to a voltage at an input terminal 332 thereof. The input terminal 332 of the third transconductance device 330 is coupled to a third input node 364 of the boosted follower amplifier component 210. A fourth transconductance device 340 is arranged to control a fourth current 345 between the second output node 355 of the boosted follower amplifier component 210 and the second supply node 305 in response to a voltage at an input terminal 342 thereof. The input terminal 342 of the fourth transconductance device 340 is coupled to a fourth input node 366 of the boosted follower amplifier component 210. In the example illustrated in FIG. 3, the first and third input nodes 360, 364 of the boosted follower amplifier component 210 are arranged to receive a first (positive) component Vin_p of the received differential input signal 205, 215 and the second and further input nodes 362, 366 of the boosted follower amplifier component 210 are arranged to receive a second (negative) component Vin_n of the received differential input signal 205, 215. Thus, in the manner the boosted follower amplifier component 210 illustrated in FIG. 2 comprises stacked pairs of cross-coupled transconductance devices 310-340.

For a differential operation, during the positive cycle of a differential input signal, the third transconductance device 330 may act as a classical follower (gain G=1) copying the voltage at the input terminal thereof 332 to the second output node 355. During the same cycle, the stacked first and second transconductance devices 310, 320 operate as a gm2×Zload buffer, where Zload represents an impedance of a load of the second transconductance device 320. Zload may be defined as 1/gm1, where gm1 is a transductance of the first transconductance device 310 (gm2 being a transductance of the second transconductance device 320, gm3 being a transductance of the third transconductance device 330 and gm4 being a transductance of the fourth transconductance device 340). The term 'transductance' may generally be used for designating a ratio of a current change ΔIout at an output of the respective transconductance device to a voltage change ΔVin at an input port of the respective transconductance device. Thus, the transductance may be written as gm=ΔIout/ΔVin.

When the first and second transconductance devices 310, 320 present a high gain G (beta), collector and emitter currents may be substantially equivalent (Ic≈Ie or simply I1=I2). Generally, the term 'beta' may be used for designating a common-emitter current gain, which may be approximately the ratio of a DC collector current to a DC base current in forward-active region of a bipolar transistor.

A gain of the stacked first and second transconductance devices 310, 320 may be defined as gm2×1/gm1. Both first and second transconductance devices 310, 320 may present a same transconductance such that gm1=gm2=gm. Thus, the gain G of the stacked first and second transconductance devices 310, 320 may simply equal to 1, as with a classical follower, however with an opposite polarity (Vout_p=−

Vin_n). A gain of the stacked third and fourth transconductance devices 330, 340 may be defined as gm4×1/gm3. Both third and fourth transconductance devices 330, 340 may present the same transconductance such that gm3=gm4=gm. Thus, the gain G of the stacked third and fourth transconductance devices 330, 340 may simply equal to 1, as with a classical follower, however with an opposite polarity (Vout_n=−Vin_p).

Accordingly, during a positive cycle of the differential input signal Vdiff(in), the differential output voltage Vdiff (out) may be expressed as:

$$V\text{diff(out)\_}p = V\text{out\_}p - V\text{out\_}n = V\text{in\_}p - (V\text{in\_}n)$$
$$\sim 2*V\text{in\_}p \qquad \text{Equation 1}$$

Similarly, during a negative cycle of the differential input signal, the differential output voltage Vdiff(out) may be expressed as:

$$V\text{diff(out)\_}n = V\text{out\_}n - V\text{out\_}p = V\text{in\_}n - (V\text{in\_}p)$$
$$\sim 2*V\text{in\_}n \qquad \text{Equation 2}$$

Thus, the differential output voltage Vdiff(out) may be generally be expressed as:

$$V\text{diff(out)} = 2*V\text{in\_}p - 2*V\text{in\_}n = 2*V\text{diff(in)} \qquad \text{Equation 3}$$

Thus, as shown in Equation 3 above, a 2*gain (corresponding to 6 dB) may be achieved. Advantageously, with such a boosted follower amplifier arrangement comprising the stacked differential configuration of transconductance devices 310-340 with inverted input phases as described above, the gain at each output node 350, 355 is defined by the transconductance (gm*1/gm) of the respective transconductance devices. Accordingly, the gain of the boosted follower amplifier component 210 illustrated in FIG. 3 is independent of the magnitude of the bias currents 315-345 through the transconductance devices for low to mid frequencies (e.g. up to 10 GHz). In this manner, a 2× gain may be achieved without increasing the current consumption of the amplifier circuit, and whilst enabling good noise performance and broadband behaviour of the amplifier. At higher frequencies, e.g. above 10 GHz, there may be some gain dependency on the bias currents because of operating at the transfer frequency fT (where the input transistor pair may offer only a low Beta—the term 'beta' designating a common-emitter current gain, which may be approximately the ratio of a DC collector current to a DC base current in forward-active region of a bipolar transistor). In this operation region the bias current may be increased for maintaining or achieving a gain G of about 6 dB.

In the example illustrated in FIG. 3, the boosted follower amplifier component 210 further comprises a current source 370 coupled to the second supply node 305 and arranged to absorb the combined second and fourth currents 325, 345. For low voltage operation, the current sources 370 may be implemented by a simple resistance, or even omitted in very low voltage operation. In alternative embodiments it is contemplated that a current source may alternatively be coupled to the first supply node 300 and arranged to supply the combined first and third currents 315, 335.

The boosted follower amplifier component 210 illustrated in FIG. 3 further comprises DC (direct current) decoupling components coupled between the input nodes 360, 362, 364, 366 and the transconductance devices 310-340. In the illustrated example, each DC decoupling component comprises an RC filter comprising a capacitance 380 coupled between the respective input node 360, 365 of the boosted follower amplifier component 210 and the input terminal 312, 322, 332, 342 of the respective transconductance device 310-340, and a resistance 385 coupled between the input terminal 312, 322, 332, 342 of the respective transconductance device 310-340 and a bias voltage node 387, 389. In some example embodiments, the resistance 385 of the DC decoupling components coupled to the input terminals 312, 332 of the first and third transconductance devices 310, 330 may be coupled to a first (e.g. higher) bias voltage node 387, and the resistance 385 of the DC decoupling components coupled to the input terminals 322, 342 of the second and fourth transconductance devices 320, 340 may be coupled to a second (e.g. lower) bias voltage node 389.

Figure 4:
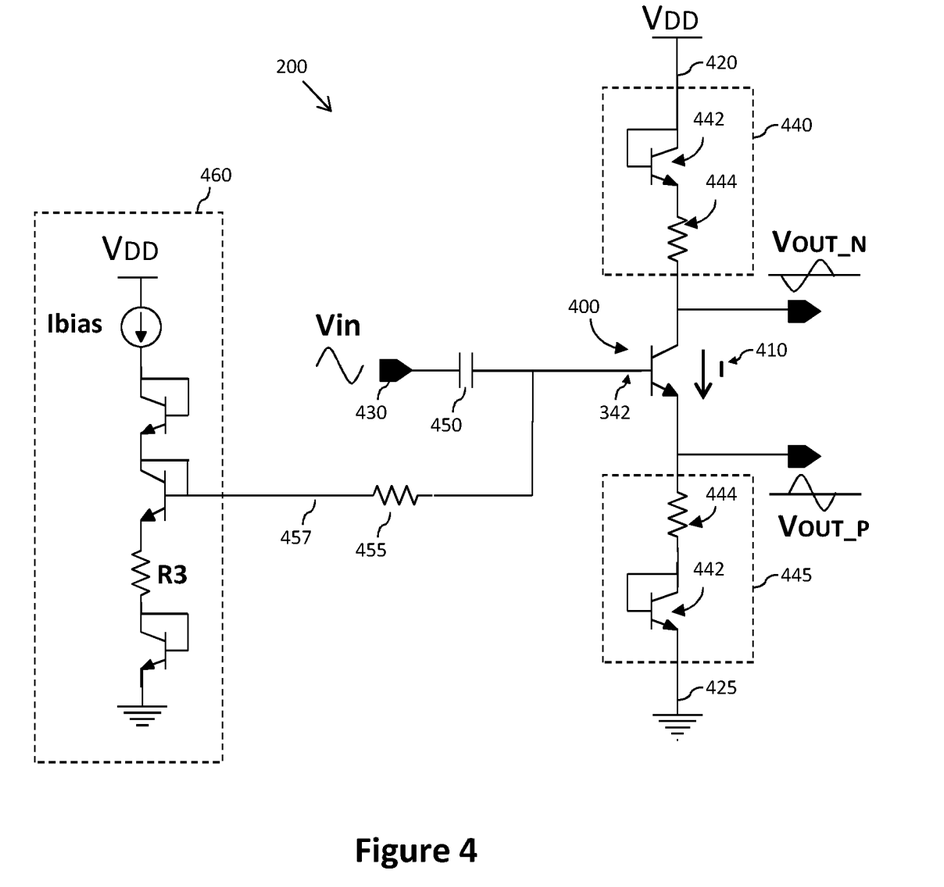
FIG. 4 schematically illustrates a simplified circuit diagram of an example of an active single-ended to differential converter.

Referring now to FIG. 4 there is schematically illustrated a simplified circuit diagram of an example of an active single-ended to differential converter 200, such as may be used to implement the single-ended to differential converter 200 illustrated in FIG. 2. The single-ended to differential converter 200 illustrated in FIG. 4 comprises a transconductance device 400 arranged to control a current 410 between a third supply node 420 and a fourth supply node 425 in response to a voltage at an input terminal 402 thereof coupled to an input node 430 of the single-ended to differential converter. In the illustrated example, the transconductance device 440 comprises a bipolar junction transistor device. However, it is contemplated that the transconductance device 400 may be implemented using another type of device, for example a metal oxide semiconductor field effect transistor or the like.

The single-ended to differential converter 200 further comprises a first resistance component 440 coupled between the transconductance device 400 and the third supply node 420, and a second resistance component 445 coupled between the transconductance device 410 and the fourth supply node 425.

In the example illustrated in FIG. 4, each of the resistance components 440, 445 comprises a base-collector shorted bipolar junction transistor device 442 coupled in series with a resistive element 444. The base-collector shorted bipolar junction transistor devices 442 limit the current 410 (and thus the current consumption of the circuit while enabling low value resistance elements 44, and thus low noise.

The single-ended to differential converter 200 further comprises a DC decoupling component coupled between the input node 43 of the single-ended to differential converter 200 and the transconductance device 400. In the example illustrated in FIG. 4, the DC decoupling component comprises an RC filter comprising a capacitance 450 coupled between the input node 430 of the single-ended to differential converter 200 and the input terminal of the transconductance device 400, and a resistance 455 coupled between the input terminal of the transconductance device 400 and a bias voltage node 457. As illustrated in FIG. 4, a bias circuit 460 may be arranged to generate a bias voltage at the bias node 457 for biasing a DC voltage of the input terminal 342 of the transconductance device 400. In some example embodiments, the RC filter may be arranged to comprise a cut-off frequency less than the high-pass filter components 160 of the receiver frontend baseband component 140 illustrated in FIG. 1.

Thus, an example of a baseband low-noise amplifier 150 has been described comprising a single-ended to differential converter 200 and one or more boosted follower amplifier component 210. Advantageously, the gain of the example boosted follower amplifier 210 illustrated in FIG. 3 is independent of its bias current, and the combined arrangement of the single-ended to differential converter 200 and boosted follower amplifier component(s) 210 takes advantage of the non-correlation between the gain and current drain of the boosted follower amplifier topology, and of its low noise performance, while providing a single to differential active conversion.

Furthermore, the current limiting influence of the base-collector shorted bipolar transistors 442 of the single-ended to differential converter 200 illustrated in FIG. 4 allows interfacing with the output of the single-ended mixer 130 of the receiver front-end 100 illustrated in FIG. 1, while preserving the low noise and broadband behaviour of the boosted follower amplifier component(s) 210. It will be appreciated that the present invention is not limited to the specific single-ended to differential converter 200 illustrated in FIG. 4. In particular, it is contemplated that any active single ended to differential converter with current limiting devices (e.g. diodes, resistors, etc.) may permit interfacing with the output of the single-ended mixer 130 of the receiver front-end 100 illustrated in FIG. 1, while (at least partially) preserving the low noise and broadband behaviour of the boosted follower amplifier component(s) 210.

Thus, the exemplary embodiment hereinbefore described enables outstanding noise performance to be achieved as compared to state of the art arrangements, while preserving low power consumption and also being capable of being integrated into a single semiconductor device. Significantly, by enabling such improved noise performance the baseband amplifier circuit herein described enables the range of an RF radar system in which it is implemented to be significantly increased.

The number n of boosted follower amplifier components implemented within the baseband amplifier circuit may vary depending on the specific application, and in particular may depend on a desired trade-off between noise, compression point, bandwidth and power consumption.

Figure 5:
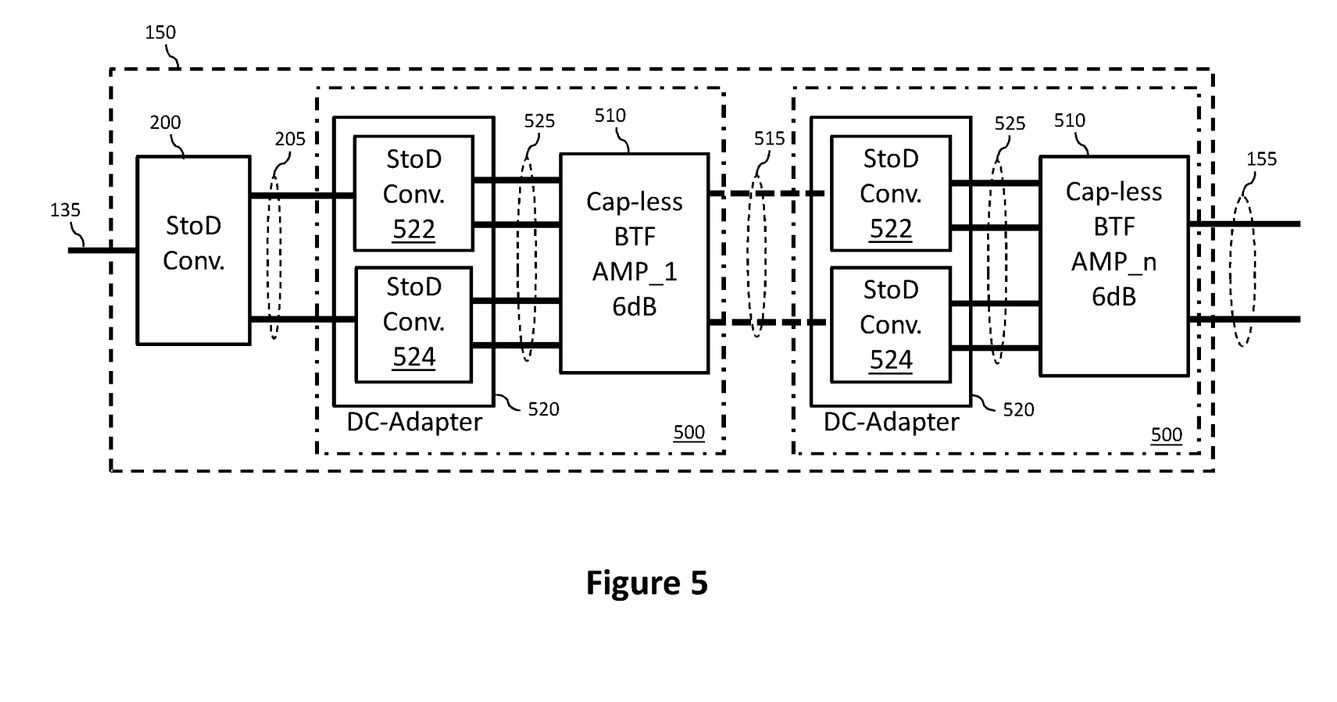
FIG. 5 schematically illustrates a simplified block diagram of an alternative example of a multi-stage baseband amplifier circuit.

FIG. 5 schematically illustrates a simplified block diagram of an alternative example of a baseband amplifier circuit 150 such as may be used to implement the baseband amplifier 150 illustrated in FIG. 1. The baseband amplifier circuit 150 of FIG. 5 comprises a single-ended to differential converter 200 arranged to receive at an input thereof a single-ended input signal to be amplified, such as the single-ended baseband frequency signal 135 output by the passive mixer component 130 of the RF receiver frontend module 100 of FIG. 1, and to convert the single-ended input signal 135 into a differential signal 205. The baseband amplifier circuit 150 of FIG. 5 further comprises a series of n (i.e. one or more) amplifier module(s) 500, coupled one after the other (output to input as illustrated in FIG. 5) when n>1.

Each amplifier module 500 comprises a DC-adapter component 520 arranged to receive at a differential input thereof a differential signal 205, 515 to be amplified and to output a pair of common-mode differential signals 525. In the example illustrated in FIG. 5, each DC-adapter component comprises a pair of single-ended to differential converters 522, 524, each arranged to receive a signal component of the received differential signal 205, 515 and to output one of the pair of common-mode differential signals 525.

Figure 6:
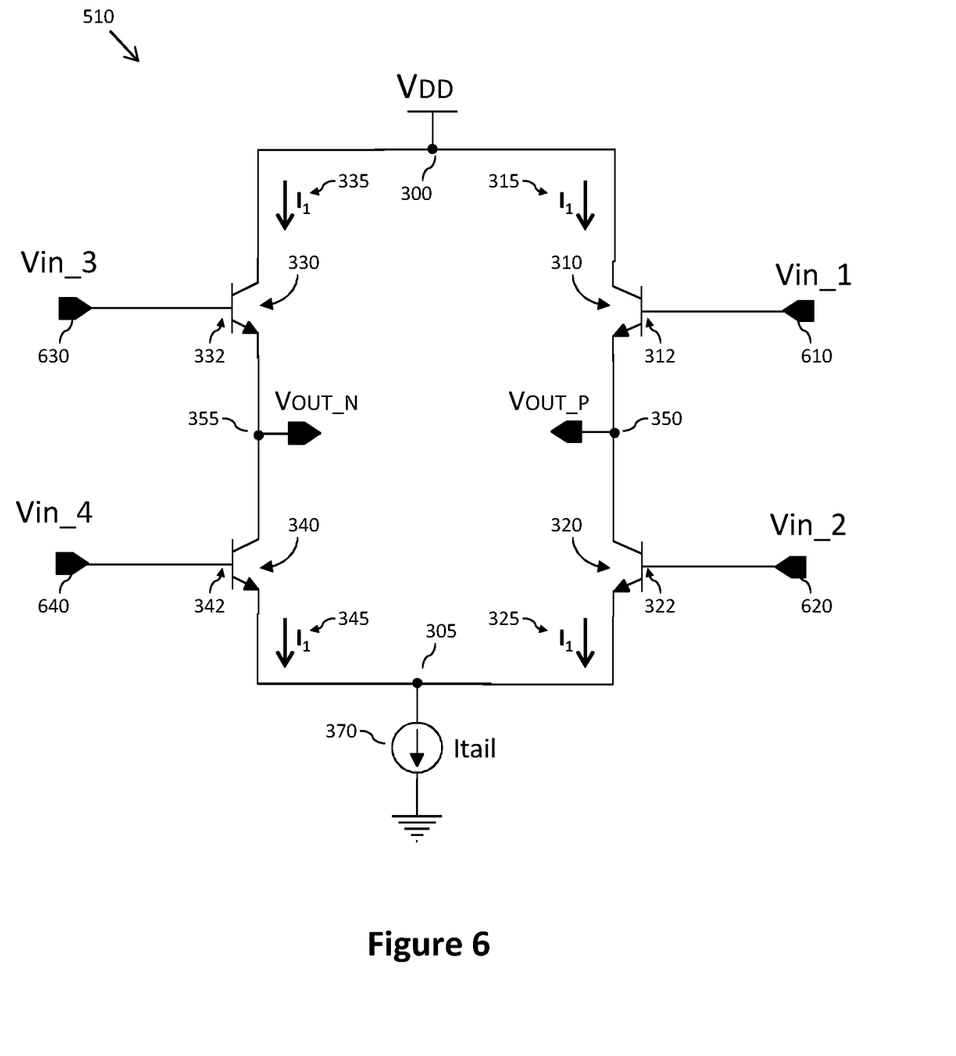
FIG. 6 schematically illustrates a simplified circuit diagram of an alternative example of a boosted follower amplifier component.

Each amplifier module 500 further comprises a boosted follower amplifier component 510 arranged to receive at differential inputs thereof the pair of common-mode differential signals 525 output by the respective DC-adapter component 520, and to output an amplified differential signal 515, 155 based on the received common-mode differential signals 525. FIG. 6 schematically illustrates an example of a boosted follower amplifier component 510 such as may be used to implement the boosted follower amplifier components 510 illustrated in FIG. 5. The boosted follower amplifier component 510 illustrated in FIG. 6 comprises four transconductance devices 310-340, which in the illustrated example are implemented by way of bipolar junction transistors. However, it is contemplated that the transconductance devices 310-340 may be implemented using other devices, for example metal oxide semiconductor field effect transistors or the like. A first transconductance device 310 is arranged to control a first current 315 between a first supply node 300 and a first output node 350 of the boosted follower amplifier component 510 in response to a voltage at an input terminal 312 thereof. The input terminal 312 of the first transconductance device 310 is coupled to a first input node 610 of the boosted follower amplifier component 510. A second transconductance device 320 is arranged to control a second current 325 between the first output node 350 of the boosted follower amplifier component 510 and a second supply node 305 in response to a voltage at an input terminal 325 thereof. The input terminal 322 of the second transconductance device 320 is coupled to a second input node 620 of the boosted follower amplifier component 510. A third transconductance device 330 is arranged to control a third current 335 between the first supply node 300 and a second output node 355 of the boosted follower amplifier component 510 in response to a voltage at an input terminal 332 thereof. The input terminal 332 of the third transconductance device 330 is coupled to a third input node 630 of the boosted follower amplifier component 510. A fourth transconductance device 340 is arranged to control a fourth current 345 between the second output node 355 of the boosted follower amplifier component 510 and the second supply node 305 in response to a voltage at an input terminal 342 thereof. The input terminal 342 of the fourth transconductance device 340 is coupled to a fourth input node 640 of the boosted follower amplifier component 510.

In the example illustrated in FIG. 6, the boosted follower amplifier component 510 further comprises a current source 370 coupled to the second supply node 305 and arranged to absorb the combined second and fourth currents 325, 345. For low voltage operation, the current sources 370 may be implemented by a simple resistance, or even omitted in very low voltage operation.

Referring back to FIG. 5, a first differential signal of the pair of common-mode differential signals 525 output by each DC-adapter component 520, for example output by the first single-ended to differential converter 522 thereof, may be provided to the first and second input nodes of the respective boosted follower amplifier component 510, whilst a second differential signal of the pair of common-mode differential signals 525 output by each DC-adapter component 520, for example output by the second single-ended to differential converter 524 thereof, may be provided to the third and further input nodes of the respective boosted follower amplifier component 510.

Advantageously, the implementation of a DC adapter component 520 to provide common-mode differential signals 525 to each boosted follower amplifier component 510 allows the DC blocking components to omitted, and in particular the need for the capacitances 380 to be omitted. As a result, a significant reduction in the die size required to implement each boosted follower amplifier component 510 may be achieved.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A baseband amplifier circuit, the baseband amplifier circuit comprising:
at least one single-ended to differential converter arranged to receive at an input thereof a single-ended input signal to be amplified and convert the single-ended input signal into a differential signal to be amplified, and
at least one amplifier module arranged to receive at a differential input thereof the differential signal to be amplified and to output an amplified differential signal based on the received differential input signal;
wherein the at least one amplifier module comprises at least one boosted follower amplifier component comprising:
a first transconductance device arranged to control a first current between a first supply node and a first output node of the boosted follower amplifier component in response to a voltage at an input terminal thereof coupled to a first input node of the boosted follower amplifier component;
a second transconductance device arranged to control a second current between the first output node of the boosted follower amplifier component and a second supply node in response to a voltage at an input terminal thereof coupled to a second input node of the boosted follower amplifier component;
a third transconductance device arranged to control a third current between the first supply node and a second output node of the boosted follower amplifier component in response to a voltage at an input terminal thereof coupled to a third input node of the boosted follower amplifier component; and
a fourth transconductance device arranged to control a fourth current between the second output node of the boosted follower amplifier component and the second supply node in response to a voltage at an input terminal thereof coupled to a fourth input node of the boosted follower amplifier component.

2. The baseband amplifier circuit of claim 1, wherein the boosted follower amplifier component of the at least one amplifier module further comprises a current source coupled to the second supply node.

3. The baseband amplifier circuit of claim 2, wherein the boosted follower amplifier component of the at least one amplifier module comprises:
- a first DC decoupling component coupled between the first input node and the first transconductance device;
- a second DC decoupling component coupled between the second input node and the second transconductance device;
- a third DC decoupling component coupled between the third input node and the third transconductance device; and
- a fourth DC decoupling component coupled between the fourth input node and the further transconductance device.

4. The baseband amplifier circuit of claim 2, wherein each DC decoupling component comprises an RC filter comprising:
- a capacitance coupled between the respective input node of the at least one boosted follower amplifier component and the input terminal of the respective transconductance device; and
- a resistance coupled between the input terminal of the respective transconductance device and a bias voltage node.

5. The baseband amplifier circuit of claim 1, wherein the first and third input nodes of the boosted follower amplifier component are arranged to receive a first component of the differential signal to be amplified and the second and further input nodes of the boosted follower amplifier component are arranged to receive a second component of the differential signal to be amplified.

6. The baseband amplifier circuit of claim 1, wherein each of the at least one amplifier module comprises:
- a DC-adapter component arranged to receive at a differential input thereof the differential signal to be amplified and to output a pair of common-mode differential signals; and
- the boosted follower amplifier component arranged to receive at differential inputs thereof the pair of common-mode differential signals output by the DC-adapter component, and to output an amplified differential signal based on the received common-mode differential signals.

7. The baseband amplifier circuit of claim 6, wherein each DC-adapter component comprises a pair of single-ended to differential converters, each arranged to receive a signal component of the received differential signal and to output one of the pair of common-mode differential signals.

8. The baseband amplifier circuit of claim 6, wherein at least one of the first and second resistance components comprises a base-collector shorted bipolar junction transistor device coupled in series with at least one resistive element.

9. The baseband amplifier circuit of claim 1, wherein the at least one single-ended to differential converter comprises an active single-ended to differential converter comprising:
- at least one further transconductance device arranged to control a current between a third supply node and a fourth supply node in response to a voltage at an input terminal thereof coupled to an input node of the at least one single-ended to differential converter;
- a first resistance component coupled between the at least one further transconductance device and the third supply node; and
- a second resistance component coupled between the at least one further transconductance device and the fourth supply node.

10. The baseband amplifier circuit of claim 9, wherein the at least one single-ended to differential converter further comprises at least one direct current, DC, decoupling component coupled between the input node of the single-ended to differential converter and the at least one further transconductance device.

11. The baseband amplifier circuit of claim 10, wherein the DC decoupling component of the at least one single-ended to differential converter comprises an RC filter comprising:
- a capacitance coupled between the input node of the at least one single-ended to differential converter and the input terminal of the at least one further transconductance device; and
- a resistance coupled between the input terminal of the at least one further transconductance device and a bias voltage node.

12. The baseband amplifier circuit of claim 1, wherein each transconductance device comprises one of a bipolar junction transistor device and a metal oxide semiconductor field effect transistor device.

13. A radio frequency, RF, frontend module comprising at least one baseband amplifier circuit according to claim 1.

14. The RF frontend module of claim 13, wherein the frontend module comprises:
- a low noise amplifier component arranged to receive an RF signal and output an amplified RF signal;
- a single-ended passive mixer component arranged to mix the amplified RF signal with a conversion signal to down-convert the amplified RF signal to a baseband frequency signal; and
- a baseband component arranged to perform baseband filtering and variable gain amplification on the baseband frequency signal, the baseband component comprising at least one baseband amplifier circuit arranged to amplify the baseband frequency signal.

* * * * *